US009305784B2

(12) United States Patent
Ninomiya et al.

(10) Patent No.: US 9,305,784 B2
(45) Date of Patent: Apr. 5, 2016

(54) ION IMPLANTATION METHOD AND ION IMPLANTATION APPARATUS

(71) Applicant: SEN CORPORATION, Tokyo (JP)

(72) Inventors: Shiro Ninomiya, Tokyo (JP); Yasuharu Okamoto, Tokyo (JP); Toshio Yumiyama, Tokyo (JP); Akihiro Ochi, Tokyo (JP)

(73) Assignee: Sen Corporation, Tokyo (JP)

( * ) Notice: Subject to any disclaimer, the term of this patent is extended or adjusted under 35 U.S.C. 154(b) by 406 days.

(21) Appl. No.: 13/748,288

(22) Filed: Jan. 23, 2013

(65) Prior Publication Data

US 2013/0196492 A1    Aug. 1, 2013

(30) Foreign Application Priority Data

Jan. 27, 2012  (JP) ................................. 2012-015034

(51) Int. Cl.
*A61N 5/00* (2006.01)
*H01L 21/265* (2006.01)
*H01J 37/317* (2006.01)

(52) U.S. Cl.
CPC ........... *H01L 21/265* (2013.01); *H01J 37/3172* (2013.01); *H01J 37/3171* (2013.01); *H01J 2237/20228* (2013.01)

(58) Field of Classification Search
None
See application file for complete search history.

(56) References Cited

U.S. PATENT DOCUMENTS

| 4,922,106 | A | * | 5/1990 | Berrian | ................ | H01J 37/3171 |
| | | | | | | 250/398 |
| 2006/0289800 | A1 | * | 12/2006 | Murrell | ................ | H01J 37/3171 |
| | | | | | | 250/492.21 |

FOREIGN PATENT DOCUMENTS

| JP | 8-213339 A | 8/1996 |
| JP | H10-116581 A | 5/1998 |
| JP | 2001-229872 A | 8/2001 |
| JP | 2006-279041 A | 10/2006 |
| JP | 2008-530785 A | 8/2008 |
| JP | 2008-262756 A | 10/2008 |
| JP | 2010-199073 A | 9/2010 |

OTHER PUBLICATIONS

Japanese Office Action issued Mar. 25, 2015; Japanese Application No. 2012-015034.

* cited by examiner

*Primary Examiner* — Reema Patel
(74) *Attorney, Agent, or Firm* — Arent Fox LLP

(57) ABSTRACT

On a plane of a semiconductor wafer, two types of in-plane regions comprising full-width non-ion-implantation regions and partial ion implantation regions, which are alternately arranged one or more times in a direction orthogonal to a scanning direction of an ion beam are created. During the creation of the partial ion implantation regions, reciprocating scanning using the ion beam can be repeated until the target dose can be satisfied while performing or stopping ion beam radiation onto the semiconductor wafer in a state in which the semiconductor wafer can be fixed. During the creation of the full-width non-ion-implantation regions, the semiconductor wafer can be moved without performing the ion beam radiation onto the semiconductor wafer. Then, by repeating fixing and movement of the semiconductor wafer plural times, ion implantation regions and non-ion-implantation regions are created in desired regions of the semiconductor wafer.

15 Claims, 6 Drawing Sheets

US 9,305,784 B2

ION IMPLANTATION METHOD AND ION IMPLANTATION APPARATUS

This application is based upon and claims the benefit of priority from Japanese Patent Application No. 2012-15034, filed on Jan. 27, 2012, the disclosure of which is incorporated herein in its entirety by reference.

TECHNICAL FIELD

The present invention relates to an ion implantation method and an ion implantation apparatus, and more particularly to control of an ion implantation amount for locally creating ion implantation regions having a length of the order of several millimeters on a semiconductor wafer using the ion implantation apparatus.

BACKGROUND ART

A process of implanting ions to a semiconductor wafer for the purpose of changing conductivity, changing a crystalline structure of a semiconductor wafer, or the like, has become a typical semiconductor manufacturing process. An apparatus used in this process is called an ion implantation apparatus. Such an ion implantation apparatus has functions of extracting ions that are ionized in an ion source as an ion beam, then forming an accelerated ion beam, and of conveying the ion beam to a semiconductor wafer so as to be implanted into the semiconductor wafer.

A semiconductor device such as an integrated circuit is formed of a number of transistors and other electronic elements. Typical sizes of a transistor that is currently manufactured is from several dozens of nm to one hundred and several dozens of nm. Within these sizes, ion implantation is performed only on a portion of a transistor, or performed for an adjacent transistor under a different condition in an ion implantation process of a semiconductor manufacturing process. An important thing in this ion implantation process is to perform ion implantation at intended positions satisfying an intended ion implantation condition over an entire plane of a semiconductor wafer.

In a general ion implantation method of the current semiconductor manufacturing process, the same ion energy, ion implantation angle, and dose are set over an entire semiconductor wafer, and based on the setting, an ion beam is formed and accelerated in an ion implantation apparatus, and the ion beam is implanted into the semiconductor wafer. Thus, when only a general ion implantation method is used, a desired ion implantation cannot be conducted at intended positions of a semiconductor wafer.

In order to perform ion implantation at intended positions on a semiconductor wafer using the above-described general ion implantation method, frequently, a resist mask is placed on the semiconductor wafer and then ion implantation is performed through the resist mask. A resist mask is in the form of a thin-film material with a porous structure having a number of extremely small pores. A porous portion of this resist mask is called an ion permeable area, and the other portion is called a resist region. An ion beam radiated on a resist region on the resist mask does not reach a semiconductor wafer, and only an ion beam radiated on an ion permeable region on the resist mask reaches the semiconductor wafer, whereby ions are implanted into the semiconductor wafer. In this manner, ion implantation can be performed at intended positions satisfying an intended ion implantation condition over an entire plane of the semiconductor wafer.

In the above-described general ion implantation method, the same ion energy, ion implantation angle, and dose are set over the entire semiconductor wafer. However, at present, there are also cases in which a special ion implantation method is used in order to make electrical characteristics of a semiconductor element within a wafer plane uniform, throughout an overall semiconductor manufacturing process. It is assumed that, for example, a certain problem occurs in a prior process to an ion implantation process during a semiconductor manufacturing process. Despite the problem, if the manufacturing process progresses without taking any measure, a defect that the electrical characteristics of the semiconductor element within the wafer plane become non-uniform may be caused. Such a defect is called wafer in-plane non-uniformity. In this case, there are cases in which a researched special ion implantation method is used in order to correct the wafer in-plane non-uniformity during the ion implantation process of the semiconductor manufacturing process. For example, by correcting the wafer in-plane non-uniformity that results from a problem arising in a prior process to the ion implantation process in such a way that the doses of ions are intentionally set non-uniform in the wafer plane during the ion implantation process of the semiconductor manufacturing process, uniformity in the electrical characteristics of the semiconductor element in the wafer plane obtained at the end of the semiconductor manufacturing process is secured. This technique can cope with the wafer in-plane non-uniformity attributable to a problem arising in a prior process to an ion implantation process during a semiconductor manufacturing process, but cannot cope with the wafer in-plane non-uniformity attributable to such a problem when the problem unexpectedly arises in a posterior process to the ion implantation process.

An important thing herein is that setting the same ion energy, ion implantation angle, and dose over an entire semiconductor wafer is required in the general ion implantation method of the semiconductor manufacturing process. Herein, particularly, securing uniformity of ion implantation angles will be described.

In general, various techniques of implanting ions over an entire plane of a semiconductor wafer are considered. As one technique that is the most easily understandable, a technique of implanting ions over an entire plane of a semiconductor wafer by performing two-dimensional scanning using an ion beam is considered. This technique had been used in ion implantation apparatuses of the past, but at present, is not used in ion implantation apparatuses for semiconductor wafers having a diameter of 200 mm or 300 mm that are mostly used as semiconductor wafers. One of the reasons is, as semiconductor elements are miniaturized, an allowable range of an error in ion implantation angles has become strict when it compared to the past. Another reason is that it is difficult to secure uniformity in ion implantation angles over an entire plane of a semiconductor wafer of which the radius has become larger when it compared to the past.

Particularly, to describe the latter reason, the following is required to set ion implantation angles to be uniform while two-dimensional scanning using an ion beam for, for example, a semiconductor wafer having a diameter of 300 mm is performed. A first electromagnetic device (beam deflecting/beam scanning device, or the like), which performs two-dimensional scanning using an ion beam and uses at least one of a magnetic field or an electric field, is installed in a beam line between an ion source and a semiconductor wafer. On the downstream side of this first electromagnetic device, a stereoscopic space having a sectional area of at least 300 mm×300 mm is secured. Then, an angle of a two-dimensionally scanned ion beam is controlled according to a two-dimensional position in this stereoscopic space, and the ion beam of which the angle is controlled is conveyed to the wafer to implant ions thereto. In order to control the angle of the ion beam, a second electromagnetic device (beam deflecting/beam scanning device, or the like), which uses at least one of a magnetic field or an electric field to perform two-dimensional angle control of an ion beam, is used.

In reality, however, there are problems of the influence of disorder in a magnetic field or an electric field of the first and second electromagnetic devices, the influence of an angle broadening effect of an ion beam caused by a space-charge effect based on electric charges of the ion beam itself that the ion beam potentially has, and a difficulty in securing performance required for ion implantation other than an ion implantation angle. Due to the above problems, when a semiconductor wafer having a diameter of 200 mm or 300 mm that is mostly used as a semiconductor wafer is used, a function of setting ion implantation angles to be uniform while two-dimensional scanning using an ion beam is performed is very difficult to be realized, except when the size of a semiconductor wafer is small.

To summarize the above description, it is very difficult to make ion implantation angles uniform over an entire plane of a semiconductor wafer having a diameter of 200 mm or 300 mm by performing two-dimensional scanning technique using an ion beam. Even if it is possible, a huge amount of cost is required, which is not realistic. In addition, a use of semiconductor wafers having a diameter of 450 mm is expected at present. It is needless to say that securing uniformity in ion implantation angles over an entire plane of the semiconductor wafer having a diameter of 450 mm further intensifies the difficulty.

On the other hand, making ion implantation angles uniform in one-dimensional direction of a semiconductor wafer having a diameter of 200 mm or 300 mm by performing one-dimensional scanning technique using an ion beam is relatively easy. Further, in order to implant such an ion beam over an entire plane of a semiconductor wafer maintaining the same ion implantation angle, it is better to move the wafer in a direction orthogonal to the scanning direction with the ion beam, which is also relatively easy. In reality, an ion implantation apparatus has been provided, in which ions generated from an ion source are conveyed to a semiconductor wafer as an ion beam, and while the scanning with the ion beam is carried out in a uniaxial direction in a reciprocating manner during the conveyance, the wafer is continuously mechanically scanned (moved) in a direction orthogonal to the scanning direction with the ion beam. Such an ion implantation apparatus has been widely used as an ion implantation apparatus for semiconductor wafers having a diameter of 200 mm or 300 mm that are mostly used as semiconductor wafers.

An important thing herein is that it is better to operate a wafer in a direction orthogonal to the scanning direction of an ion beam while the scanning with the ion beam is carried out in a uniaxial direction in a reciprocating manner in order to maintain the same ion implantation angle in a wafer plane, and thus consecutive scanning (moving) of a wafer is not a necessary condition. In the above-described general ion implantation method, consecutive scanning of a semiconductor wafer is performed to set the same dose of ions over the entire semiconductor wafer. However, if maintenance of the same ion implantation angle is merely aimed, ion implantation angles may be maintained to be the same in any methods in which ion implantation is performed by intermittently moving a semiconductor wafer, and in which ion implantation is performed by fixing a semiconductor wafer, then the semiconductor wafer is moved, and then ion implantation is performed by fixing the semiconductor wafer at another position.

To be described later, in the present invention, it is possible to create ion implantation regions and non-ion-implantation regions having a length of several mm or longer within a wafer plane, but as one example showing the necessity of creating such ion implantation regions and non-ion-implantation regions, there is correction for wafer in-plane non-uniformity in a semiconductor manufacturing process.

In an ion implantation process of a semiconductor manufacturing process, for example, there are cases in which a problem occurs and accordingly a semiconductor wafer that has undergone non-uniform ion implantation is made, but in the above-described general ion implantation method, the correction is not made. In other words, it is necessary for a semiconductor wafer that has already undergone ion implantation but experienced non-uniform implantation of ions to create ion implantation regions and non-ion-implantation regions within a wafer plane in order to perform the correction using the same ion implantation.

In addition, if, during a semiconductor manufacturing process, the manufacturing process progresses without change even though a problem occurs unexpectedly in a posterior process to an ion implantation process, there are also cases in which a semiconductor wafer in which the electrical characteristics of a semiconductor element within the wafer plane are non-uniform is made. In this case, correcting the electrical characteristics is considered in such a way that the semiconductor manufacturing process is stopped first, and an ion implantation process is performed again only for a portion in which non-uniformity of the electrical characteristics is generated within the semiconductor wafer or a new ion implantation process is added. However, also in this case, the correction of the electrical characteristics cannot be performed using the above-described general ion implantation method. In other words, also in this case, it is necessary to create ion implantation regions and non-ion-implantation regions within a wafer plane.

The occurrence of the wafer in-plane non-uniformity is attributable to a mechanical problem or an electromagnetic problem of a semiconductor manufacturing apparatus during a semiconductor manufacturing process, resulting in wafer in-plane non-uniformity having a sufficiently large length range in comparison to a semiconductor element. In other words, when ion implantation regions and non-ion-implantation regions are created within a wafer plane and are used in correcting the wafer in-plane non-uniformity of the semiconductor manufacturing process, the minimum length of a region of the typical ion implantation region may be 10 mm or longer. The maximum length of a region may be 50 mm or shorter, and when ion implantation is performed in a region having the length or longer, a plurality of ion implantation regions may be combined.

Note that ion implantation regions and non-ion-implantation regions are created within a wafer plane and used in correcting wafer in-plane non-uniformity of a semiconductor manufacturing process is one example, and various kinds of applications are considered by creating ion implantation regions and non-ion-implantation regions in the wafer plane. An important thing herein is that the performance of ion implantation in an ion implantation region should be the same as that of the above-described general ion implantation method. In other words, the ion energy, ion implantation angle, and dose should be controlled to a certain degree of accuracy. In addition, also when ion implantation regions are scattered within a wafer plane, and when intended ion implantation is the same in each of the ion implantation regions, the ion implantation angle, and the dose in each of the ion implantation regions are required to be uniform. In addition, the external environment in ion implantation should be the same as in the above-described general ion implantation method. In other words, the level of metal contamination, the level of cross contamination, the level of ion energy contamination, the level of the number of particles, and the like, which are deemed to be important in an ion implantation process of a semiconductor manufacturing process, should be the same as those in the above-described general ion implantation method. Herein, the level of metal contamination is the amount of various kinds of metal atoms implanted in a semiconductor wafer during ion implantation, and the level of cross contamination is the amount of ions in atoms other than the kinds of target atoms implanted in a semiconductor wafer during ion implantation. The level of ion energy contamination is the amount of ions which are implanted in a wafer during ion implantation having energy different from a target energy. The level of the number of particles is the amount of substances conveyed onto the surface of a wafer during ion implantation.

In an ion implantation process of a general semiconductor manufacturing process, a resist mask that has already been described is used in order to create ion implantation regions and non-ion-implantation regions within a wafer plane. The resist mask can create ion implantation regions and non-ion-implantation regions with very high accuracy, but cost thereof is very high, and posterior processes are very complicated. Thus, the resist mask is not appropriate for an object of the present invention that ion implantation regions and non-ion-implantation regions having a length of several mm or longer are created within a wafer plane.

In the related art, as a technique for creating ion implantation regions in a given portion on a semiconductor wafer, a technique in which a mask made of a metal material or a carbon material having a number of holes is used so as to radiate only a beam that passed through the hole portion of the mask onto a semiconductor wafer without using a resist mask has been used. Such a mask having a number of holes is called a stencil mask. When such a stencil mask is used, the area and the position of an ion implantation region are decided by the size and the position of the hole portion of the stencil mask. As a method using the stencil mask, for example, there is the technique disclosed in JP-A-H08-213339 (Patent Document 1).

On the other hand, a technique of creating ion implantation regions having two-dimensional distribution on a semiconductor wafer using a plurality of movable masks installed on an ion implantation apparatus without using a resist mask or a stencil mask has also been proposed in JP-A-2001-229872 (Patent Document 2).

When a stencil mask is used, in order to realize ion implantation in which the areas and positions of ion implantation regions differ, it is necessary to prepare stencil masks that satisfy each condition, and an operation of replacing stencil masks for each time of ion implantation is required. In the technique of the Patent Document 1, the plurality of stencil masks are prepared, but since the areas and positions of required ion implantation regions are considered to be diversified, the replacement of stencil masks is essential, and as a result, enormous cost and preparation time are required.

In the technique of the Patent Document 2, the replacement of stencil masks is not necessary as a movable mask is used, but since an ion beam is radiated directly to the mask, the effect on the mask remains. Specifically, previously, the level of cross contamination worsens due to the effect of the type of ions radiated on a mask. In addition, the level of ion energy contamination worsens due to the effect of degassing arising from a mask caused by radiation of an ion beam. Further, the level of the number of particles worsens due to the effect of the particles deriving from a mask. In addition, when a metal material is used as a mask material, the level of metal contamination also worsens. In other words, the external environment during ion implantation cannot be said to be the same as that in the above-described general ion implantation method.

In addition, in the technique of the Patent Document 2, since an ion beam is radiated directly to a movable mask, a constituent material of the movable mask is sputtered by the ion beam or sublimated due to radiation heat of the ion beam as time elapses, the shape of the movable mask gradually changes, and as a result, the movable mask should be replaced. Thus, though not to the extent of using a stencil mask, cost for replacing the movable mask resultantly incurs, and a preparation time is also required.

Further, in the technique of the Patent Document 2, it is necessary to perform two-dimensional scanning using an ion beam. Thus, the technique of the Patent Document 2 cannot be adopted to an ion implantation apparatus that does not have the function of two-dimensional scanning using an ion beam.

In addition, in the technique of the Patent Document 2, it is necessary to perform two-dimensional scanning using an ion beam, but it is difficult to make ion implantation angles within a wafer plane uniform in the first place in the two-dimensional scanning using an ion beam as already described. Thus, in the technique of the Patent Document 2, when ion implantation regions are scattered within a wafer plane, the ion implantation angles in each ion implantation region are not uniform.

In addition, in the techniques of the related art, since only ion implantation regions with the same dose can be created within a wafer plane in one time of a series of ion implantations, when the plural types of ion implantation regions with different doses are to be created within a wafer plane, it is necessary to perform ion implantation plural times, whereby the productivity deteriorates. One time of a series of ion implantations refers to an ion implantation process in which ion implantation beginning from one end of a wafer in a diameter direction continues until it reaches the other end of the wafer in the diameter direction.

SUMMARY

The present invention intends to realize the following details.

In an ion implantation method using an ion implantation apparatus that does not have a function of two-dimensional scanning using an ion beam, it is designed to create ion implantation regions and non-ion-implantation regions within a wafer plane without using a material of a mask shape such as a resist mask, a stencil mask, or a movable mask.

It is designed to create a plurality of ion implantation regions having a length of 10 mm or shorter within a semiconductor wafer plane as the above-described ion implantation regions.

The ion implantation region lengths are set to be changeable.

It is designed to create the plural types of ion implantation regions having different doses within a wafer plane using one time of a series of ion implantation.

Performance of ion implantation in the above-described ion implantation regions, i.e. control accuracy in ion energy, ion implantation angles, and doses are set to be the same level as in the general ion implantation method.

The external environment during ion implantation such as the level of metal contamination, the level of cross contamination, the level of ion energy contamination, and the level of the number of particles, is set to be the same as in the general ion implantation method.

According to an embodiment of the present invention, there is provided an ion implantation method using an ion implantation apparatus in which ions generated in an ion source are conveyed to a wafer as an ion beam, reciprocating scanning using the ion beam is performed in a scanning direction of an uniaxial direction in the middle of the conveyance, the scanned ion beam can be deflected so as to be directed to the same direction, and the wafer can be moved to a direction orthogonal to the scanning direction of the ion beam, two types of in-plane regions which are alternately arranged at least one time or more in the direction orthogonal to the scanning direction of the ion beam are set on a wafer plane; one type of in-plane regions out of the two types is set to be full-width non-ion-implantation regions into which ions are not implanted over the entire widths of the set in-plane regions and the other type of in-plane regions out of the two types is set to be partial ion implantation regions in which ion implantation regions into which ions are implanted and regions into which ions are not implanted are alternately repeated in the scanning direction of the ion beam; and, in each of the two types of the in-plane regions, ions are implanted only into predetermined regions within the wafer plane and ions are not implanted in regions other than them by performing ion implantation processes under different conditions.

Further in the ion implantation method, when the partial ion implantation regions are created, ion implantation may be performed by fixing the wafer, and when the full-width non-ion-implantation regions are created, the wafer may be moved without performing ion implantation, and fixing and movement of the wafer are repeated plural times, which is one of characteristics of the present invention.

Further in the ion implantation method, on the wafer plane, ion implantation angles to the wafer plane in the plural ion implantation regions set may be parallel with one another in any of the ion implantation regions, which is one of characteristics of the present invention.

Further in the ion implantation method, the necessary number of scanning times of the ion beam may be obtained from calculation based on set doses of the ion implantation regions and a beam current value measured in advance before ion implantation into the wafer is performed, and the set doses of the ion implantation regions may be realized by performing scanning of the ion beam by the obtained number of scanning times in the partial ion implantation regions with the wafer fixed, which is one of characteristics of the present invention.

Further in the ion implantation method, the full-width non-ion-implantation regions may be created by stopping ion beam radiation onto the wafer in such a way that a trajectory of the ion beam is deflected by intentionally applying a voltage to an electrode that is installed in an ion conveyed region from the ion source to the wafer, and the partial ion implantation regions may be created by stopping ion beam radiation onto the wafer in such a way that voltage application to the electrode is removed at positional coordinates decided in advance on the wafer when the creation of the ion implantation regions is started, and the voltage is intentionally applied to the electrode at positional coordinates decided in advance on the wafer when the creation of the ion implantation regions ends, which is one of characteristics of the present invention.

In addition, a scanning frequency of the ion beam at the time of measuring the ion beam before ion implantation into the wafer is performed that is performed for measuring a beam width in the direction orthogonal to the scanning direction of the scanned ion beam and a beam current value of which the beam passes through a unit area in a unit time may be different from a scanning frequency of the ion beam during ion implantation into the wafer plane, which is one of characteristics of the present invention.

Further, it can be said that realization of both of a first ion implantation method, using the same ion implantation apparatus, in which ions generated from an ion source are conveyed to a wafer as an ion beam, ion implantation is performed with the wafer fixed during creation of partial ion implantation regions while reciprocating scanning using the ion beam is performed in the middle of the conveyance, the wafer is moved without performing ion implantation during creation of full-width non-ion-implantation regions, and ions are implanted only in predetermined positions within a wafer plane and ions are not implanted in positions other than them by repeating fixing and movement of the wafer plural times, and a second ion implantation method in which ions generated from the ion source are conveyed to a wafer as an ion beam, the wafer is continuously mechanically scanned (moved) in a direction orthogonal to a scanning direction of the ion beam while reciprocating scanning using the ion beam is performed in a uniaxial direction in the middle of the conveyance so as to perform uniform ion implantation over an entire wafer plane is also one of the characteristics of the present invention.

According to certain embodiments of the present invention, in an ion implantation method using an ion implantation apparatus that does not have a two-dimensional scanning function of an ion beam, ion implantation regions and non-ion-implantation regions can be created within a wafer plane without using an object of a mask shape such as a resistor mask, a stencil mask, or a movable mask.

According to certain embodiments of the present invention, a plurality of ion implantation regions having a length of 10 mm or shorter can be created within a semiconductor wafer plane, and ion implantation regions of which a length can be controlled to be equal to or higher than 2 mm and lower than and equal to 80 mm can be created.

According to certain embodiments of the present invention, plural types of ion implantation regions having different length and doses can be created within a wafer plane using one time of a series of ion implantation.

According to certain embodiments of the present invention, ion implantation regions having the same level of control accuracy in ion energy, ion implantation angles, and doses as in the general ion implantation method can be created.

According to certain embodiments of the present invention, ion implantation regions and non-ion-implantation regions can be created within a wafer plane while the external environment during ion implantation such as the level of metal contamination, the level of cross contamination, the level of ion energy contamination, the level of the number of particles, and the like is set to be the same level as in the general ion implantation method.

According to certain embodiments of the present invention, in an ion implantation apparatus that does not have a two-dimensional scanning function of an ion beam, ion implantation regions and non-ion-implantation regions can be created within a wafer plane without using an object of a mask shape such as a resist mask, a stencil mask, or a movable mask.

DESCRIPTION OF EXEMPLARY EMBODIMENTS

Figure 1:
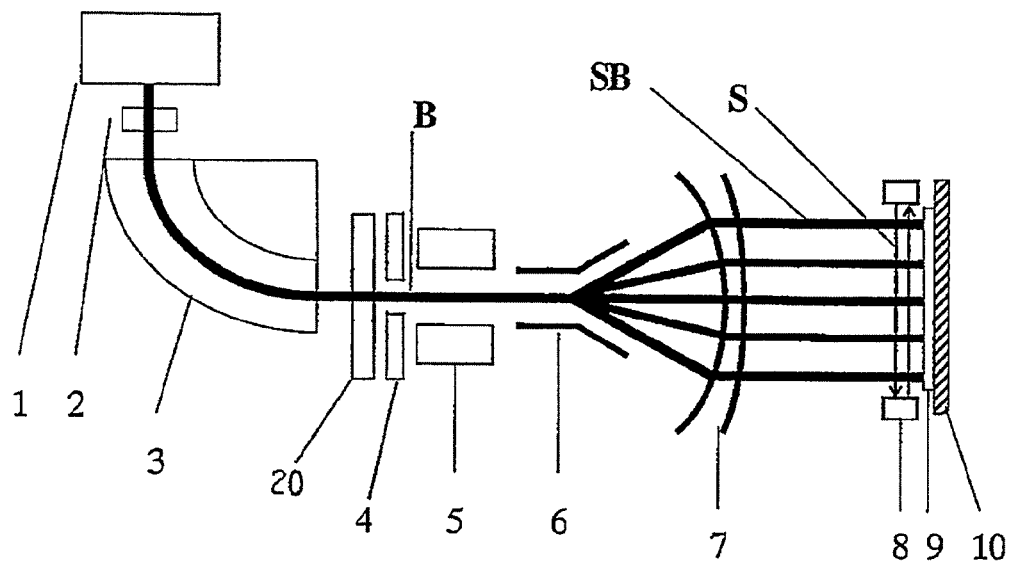
FIG. 1 is schematic diagram for illustrating an example of a configuration of an ion implantation apparatus according to an embodiment of the present invention.

With reference to FIG. 1, an example of an ion implantation method and an ion implantation apparatus according to certain embodiments of the present invention will be described. In certain embodiments of the present invention, an ion implantation apparatus, in which ions generated in an ion source 1 are conveyed to a semiconductor wafer 9 as an ion beam so as to enable reciprocating scanning using the ion beam in a uniaxial (linear) direction during the conveyance, is used. To describe in more detail, the ions are extracted by an extraction electrode 2 from the ion source 1 so as to become an ion beam. Using a mass spectrometry magnet device 3 and a mass spectrometry slit 4, ions having a target ion type, and ion energy are selected from the ion beam. The semiconductor wafer 9 is one-dimensionally scanned with the ion beam including the selected ions in a reciprocating manner in the longitudinal direction on the plane of FIG. 1 using a beam scanner 6. The longitudinal direction on the plane of FIG. 1 is, for example, the horizontal direction. As the beam scanner 6, any one of an electric field type and a magnetic field type may be used.

A traveling direction of the ion beam incident to the beam scanner 6 is fixed, but the ion beam is deflected by the beam scanner 6 so as to form an angle with respect to the fixed traveling direction during the incidence to the beam scanner. However, as shown in FIG. 1, the ion beam that is deflected so as to have an angle with respect to the fixed traveling direction is parallelized so as to be parallel with the fixed traveling direction by the function of a parallel lens 7, in other words, set to be directed to the same direction as the fixed traveling direction, and then guided to the semiconductor wafer 9.

Note that, in FIG. 1, B indicates ion beam, SB indicates the ion beam that has been deflected and parallelized, and S indicates the scanning direction of the ion beam.

In certain embodiments of the present invention, in the region of ion conveyance from the ion source 1 to the semiconductor wafer 9 (beam line), a one-dimensional paralleling beam line constituent element which maintains an implantation angle of the ion beam to the semiconductor wafer 9 to be uniform within a wafer plane is arranged. Hereinbelow, the one-dimensional paralleling beam line constituent element is called the parallel lens 7. The semiconductor wafer 9 is held on a wafer holding device 10. Though it will be described later in detail, in certain embodiments of the present invention, ion implantation regions and full-width non-ion-implantation regions are created on the wafer plane. In certain embodiments of the present invention, during the creation of the ion implantation regions, ion implantation is performed in a fixed state of the semiconductor wafer 9 without driving the wafer holding device 10. In addition, during the creation of the full-width non-ion-implantation regions, the wafer holding device 10 is driven so as to move the semiconductor wafer 9 without performing ion implantation. In certain embodiments of the present invention, by repeating the wafer fixing and the wafer movement plural times, the ion implantation regions and the full-width non-ion-implantation regions are created on the semiconductor wafer 9.

FIG. 1 shows a wafer region beam measurement device 8. The wafer region beam measurement device 8 shown in FIG. 1 measures a beam current of an ion beam while moving in the scanning direction of the ion beam before the ion implantation, and is moved to a withdrawal position during ion implantation into the semiconductor wafer 9, which is an example. Though it will be descried later in detail, in certain embodiments of the present invention, the wafer region beam measurement device 8 measures the beam width of a scanned ion beam in a direction orthogonal to the scanning direction and the beam current of an ion beam that passes a unit area in a unit time. For this reason, the wafer region beam measurement device 8 may have the above-described measurement function, may be a fixed multi-faraday-cup-type beam measurement device, may be disposed in the front or rear side of the semiconductor wafer 9, or may be disposed in plural.

In addition, FIG. 1 shows an electrostatic lens 5 on the ion conveyed region from the ion source 1 to the semiconductor wafer 9. If there is no electromagnetic field lens in the ion conveyed region from the ion source 1 to the semiconductor wafer 9, it is difficult to convey a sufficient amount of an ion beam to the semiconductor wafer 9 or to control the beam sectional shape. As an electromagnetic field lens, a magnetic field lens is known in addition to the electrostatic lens 5 as shown in FIG. 1, and either or both of the lenses are used. Note that, in FIG. 1, the electrostatic lens 5 is arranged between the mass spectrometry slit 4 and the beam scanner 6, but this is an example, and the electrostatic lens 5 may be disposed at another position in the ion conveyed region from the ion source 1 to the semiconductor wafer 9, and a plurality of electrostatic lenses 5 may be disposed.

As obvious from FIG. 1, the ion implantation apparatus of certain embodiments of the present invention has many common portions to a general ion implantation apparatus in terms of a hardware configuration. The general ion implantation apparatus is an ion implantation apparatus in which ions generated in an ion source are conveyed to a semiconductor wafer as an ion beam, reciprocating scanning using the ion beam is performed in a uniaxial direction during the conveyance, and ion implantation can be uniformly performed on an entire wafer plane by causing the semiconductor wafer to be consecutively and mechanically scanned (moved) in a direction orthogonal to the scanning direction of the ion beam, and the apparatus is hereinafter called a hybrid scan ion implantation apparatus. Specifically, the ion implantation apparatus of certain embodiments of the present invention and the hybrid scan ion implantation apparatus comprise the ion source 1, the extraction electrode 2, the mass spectrometry magnetic device 3, the mass spectrometry slit 4, the beam scanner 6, the parallel lens 7, and the wafer region beam measurement device 8 as common elements. Thus, if the wafer holding device 10 used in certain embodiments of the present invention is configured so as to exhibit a function required in the hybrid scan ion implantation apparatus, the ion implantation apparatus of certain embodiments of the present invention and the hybrid scan ion implantation apparatus can be realized by the same hardware.

Figure 2:
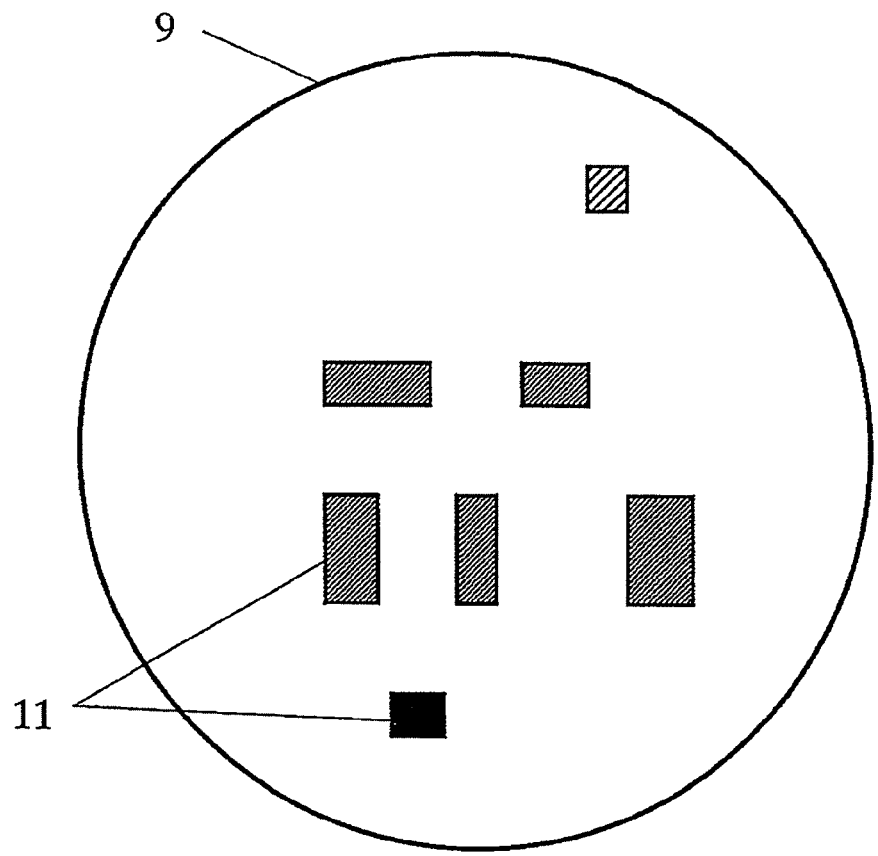
FIG. 2 is a diagram for illustrating an example of ion implantation regions set within a wafer plane.

With reference to FIG. 2, the control of the ion implantation regions in the semiconductor wafer will be described. As already described, for the purpose of correcting non-uniformity in a wafer plane in a semiconductor manufacturing process, for example, the creation of ion implantation regions 11 and non-ion-implantation regions within a plane of the semiconductor wafer 9 is considered. The required ion implantation regions 11 can be randomly created within a plane of the semiconductor wafer 9. In certain embodiments of the present invention, the ion implantation region length of the ion implantation regions 11 is assumed to be 2 mm or longer. In addition, as shown in FIG. 2, the number of the required ion implantation regions 11 can generally be plural within a plane of the semiconductor wafer 9. The ion implantation region length of the plurality of the ion implantation regions 11 is considered to have several or more types. Further, as schematically shown by the density of diagonal hatching or dotted hatching in FIG. 2, the doses required for the ion implantation regions 11 are also considered to be different in each of the plurality of ion implantation regions 11. According to certain embodiments of the present invention, the plurality of the ion implantation regions 11 in a form satisfying the required specifications can be created in the plane of the semiconductor wafer 9.

Figure 3:
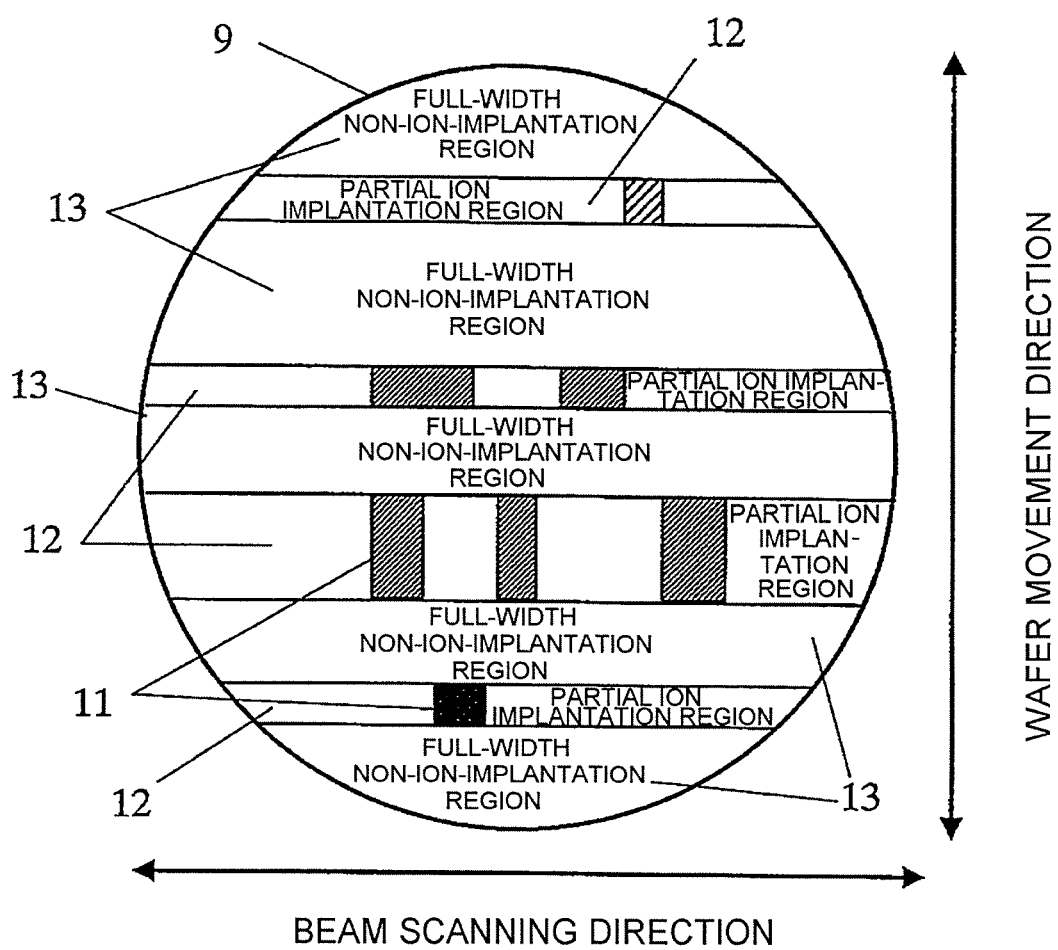
FIG. 3 is a diagram for illustrating a technique of creating ion implantation regions within a wafer plane.

With reference to FIG. 3, a technique of creating the ion implantation regions in the semiconductor wafer will be described. First, a scanning direction of an ion beam for the semiconductor wafer 9 is decided. According to certain embodiments of the present invention, since the ion implantation apparatus in which reciprocating scanning using an ion beam in a uniaxial direction is possible, and the semiconductor wafer can be moved in a direction orthogonal to the scanning direction of the ion beam is used, the scanning direction of the ion beam is one-dimensional. The scanning direction of the ion beam may be decided based on how the ion implantation regions 11 will be created in the plane of the semiconductor wafer 9. In FIG. 3, the scanning direction of the ion beam is set to be the horizontal direction.

According to certain embodiments of the present invention, after the scanning direction of the ion beam in the plane of the semiconductor wafer 9 is set, a plurality of partial ion implantation regions 12 and full-width non-ion-implantation regions 13 are set to be in strip shapes as in-plane regions in a direction orthogonal to the scanning direction of the ion beam. In FIG. 3, since the scanning direction of the ion beam is set to be the horizontal direction, the partial ion implantation regions 12 and the full-width non-ion-implantation regions 13 repeatedly appear in an alternate manner in the longitudinal direction of FIG. 3. In the example of FIG. 3, 4 partial ion implantation regions 12 and 5 full-width non-ion-implantation regions 13 are set. Herein, the partial ion implantation regions 12 include one or more ion implantation regions 11, but the full-width non-ion-implantation regions 13 do not include even one ion implantation region. In other words, the full-width non-ion-implantation regions 13 are set to be regions in which ions are not implanted over the full width of the set regions.

In addition, as obvious from FIG. 3, there are ion implantation regions 11 and non-ion-implantation regions in one partial ion implantation region 12. Each ion implantation regions 11 is a region indicated by diagonal hatching or dotted hatching, and each non-ion-implantation region is a region other than that. In addition, when a plurality of ion implantation regions 11 are included in the partial ion implantation region 12, each of the ion implantation regions 11 is separated by the non-ion-implantation regions. If expressed using different terms, it can be said that the ion implantation regions 11 and non-ion-implantation regions alternately repeat in the partial ion implantation region 12.

According to certain embodiments of the present invention, two types of in-plane regions which are alternately arranged one or more times are set in a direction orthogonal to the scanning direction of the ion beam, and by performing different ion implantation processes in each of the in-plane regions, ions are implanted only into predetermined positions in the plane of the semiconductor wafer 9, in other words, portions indicated by the diagonal hatching or dotted hatching in FIG. 3, and ions are not implanted into portions other than them.

Specifically, according to certain embodiments of the present invention, when the partial ion implantation regions 12 are to be created, ions are implanted by fixing the semiconductor wafer 9. Thus, when a partial ion implantation region 12 is created, the range that is easily affected by ions in the plane of the semiconductor wafer 9 is decided. In other words, in the scanning direction of an ion beam (the horizontal direction in FIG. 3), each point of the beam scanning direction on the semiconductor wafer 9 can be affected by ions. On the other hand, in a direction orthogonal to the scanning direction of an ion beam (the longitudinal direction in FIG. 3), only the range of the beam width of a scanned ion beam in a direction orthogonal to the scanning direction can be affected by ions. That is to say, only a limited range in a direction orthogonal to the scanning direction of an ion beam (the longitudinal direction in FIG. 3) in the plane of the semiconductor wafer 9 can be affected by ions. In other words, when the partial ion implantation region 12 is created, the length of the partial ion implantation region 12 in a direction orthogonal to the scanning direction of an ion beam (the length in the longitudinal direction in FIG. 3) can be controlled by controlling the beam width in the direction orthogonal to the scanning direction of a scanned ion beam.

The length of the partial ion implantation region 12 in the direction orthogonal to the scanning direction of an ion beam is equal to the ion implantation region length of the ion implantation region 11 included in the partial ion implantation region 12 in the direction orthogonal to the scanning direction of the ion beam. For this reason, by controlling the length of the partial ion implantation region 12 in the direction orthogonal to the scanning direction of the ion beam, the length of the ion implantation region 11 in the direction orthogonal to the scanning direction of the ion beam can be controlled.

Herein, since any electromagnetic field lens such as the electrostatic lens 5, the magnetic field lens, and the like as shown in FIG. 1 as an example are disposed in the ion conveyed region from the ion source 1 to the semiconductor wafer 9, the beam width in the direction orthogonal to the scanning direction of the ion beam can be controlled using the electromagnetic field lens, without using an object in a mask shape such as a resist mask, a stencil mask, or a movable mask. In certain embodiments of the present invention, the electromagnetic field lens that can control the beam width in the direction orthogonal to the scanning direction of the ion beam in the range of 2 mm or wider and 80 mm or narrower is used. Thus, the length of the partial ion implantation region 12 in the direction orthogonal to the scanning direction of the ion beam can also be controlled in the range of 2 mm or longer and 80 mm or shorter. Accordingly, as a result, the length of the ion implantation region 11 in the direction orthogonal to the scanning direction of the ion beam can be controlled in the range of 2 mm or longer and 80 mm or shorter. In other words, in FIG. 3, the length of the ion implantation region 11 in the longitudinal direction can be controlled in the range of 2 mm or longer and 80 mm or shorter by controlling the beam width in the direction orthogonal to the scanning direction of the ion beam.

A plurality of types of the length of the ion implantation region 11 in the direction orthogonal to the scanning direction of the ion beam are set in the plane of the semiconductor wafer 9, the beam width in the direction orthogonal to the scanning direction of the ion beam may be changed and then controlled when ions are implanted into each of the partial ion implantation regions 12.

Figure 8:
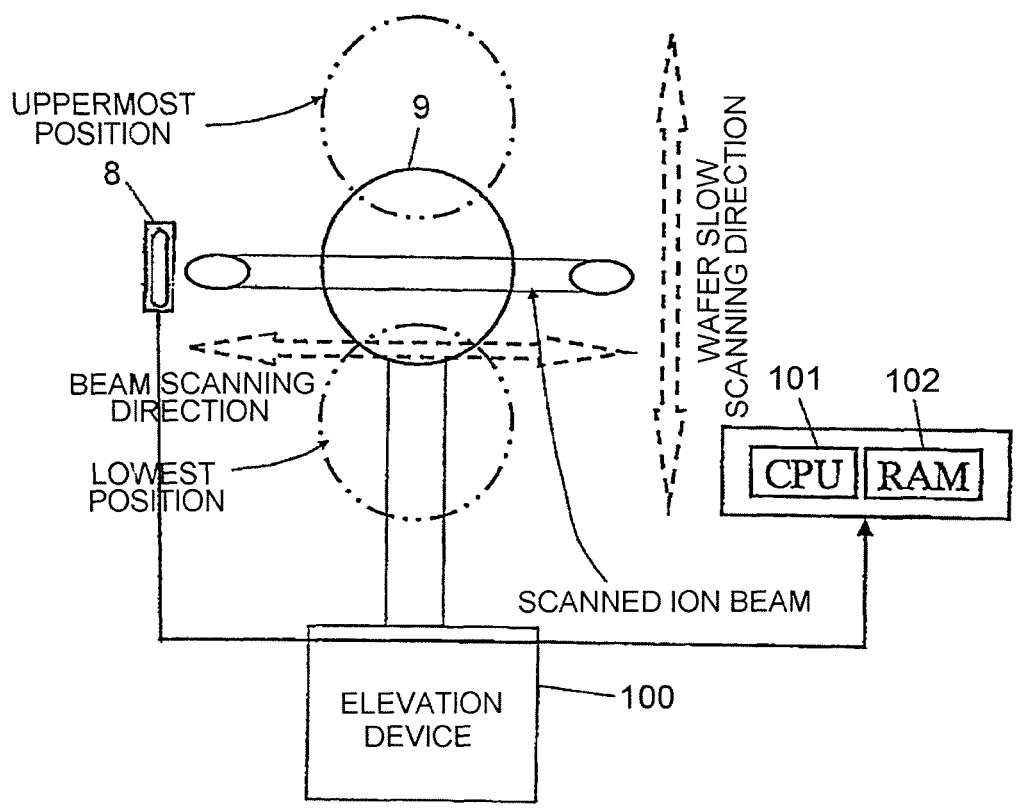
FIG. 8 is a diagram for illustrating an example of a mechanical scanning device included in an ion implantation apparatus according to an embodiment of the present invention.

Herein, with reference to FIG. 8, an operation of the ion implantation apparatus during ion implantation into the semiconductor wafer 9 will be further described. In FIG. 8, the beam scanner 6 (of FIG. 1) performs scanning using an ion beam in the horizontal direction (the scanning direction of the ion beam). On the other hand, the semiconductor wafer 9 is held by the wafer holding device 10 (of FIG. 1), and is scanned (moved) in the longitudinal (vertical) direction (wafer slow scanning direction) by an elevation device 100. In FIG. 8, an operation of the ion implantation apparatus is described by showing the highest position and the lowest position of the semiconductor wafer 9. FIG. 8 shows a state in which scanning is performed using an ion beam of which the sectional shape is horizontally long (in other words, an elliptical shape) so as to radiate the semiconductor wafer 9 in a scanned ion beam as an example. However, the sectional shape of the ion beam that is generally the target of scanning by the beam scanner 6 is not limited to the horizontally long shape as in FIG. 8, and there are cases in which the sectional shape thereof is vertically long, or close to a circle.

The ion implantation apparatus to which certain embodiments of the present invention can be applied includes a mechanical scanning device (driving unit) that controls the speed of wafer slow scanning of the semiconductor wafer 9. The mechanical scanning device is controlled by a CPU (Central Processing Unit) (control means) 101 that is charge of controlling the whole ion implantation apparatus. The CPU 101 reads a control program from a storage device (not shown) in which a control program necessary for executing the control of the whole ion implantation apparatus is stored, and executes a control operation based on the control program using data stored in a RAM (Random Access Memory) 102 used as a temporary storage device.

With regard to a control operation of the mechanical scanning device, a position of the semiconductor wafer 9 in the longitudinal direction (wafer slow scanning direction) and a beam current value of the ion beam are measured so as to be stored in the RAM 102. While reading a position of the semiconductor wafer 9 in the wafer slow scanning direction stored in the RAM 102 if necessary, the CPU 101 appropriately controls the speed of wafer slow scanning of the semiconductor wafer 9 in accordance with the measured beam current value.

In addition, when electric discharge occurs in an apparatus for beam conveyance from the ion source 1 to the semiconductor wafer 9 and then ions fail to reach the semiconductor wafer 9, for example, the CPU 101 executes the following control. The CPU 101 first stops wafer slow scanning of the semiconductor wafer 9. Then, after the electric discharge of the apparatus for beam conveyance is resolved, the CPU 101 reads a position of the semiconductor wafer 9 in the wafer slow scanning direction stored in the RAM 102 immediately before the stop of the wafer slow scanning, and resumes ion implantation from the read position. Accordingly, wafer in-plane uniformity of ion implantation dose is secured.

The CPU 101 executes a control operation of ion implantation regions to be described below, in addition to a control operation of the mechanical scanning device as above. The control operation of the ion implantation regions is a control operation for creating the partial ion implantation regions 12 and the full-width non-ion-implantation regions 13 described above. In other words, the creation of the partial ion implantation regions 12 and the full-width non-ion-implantation regions 13 to be described below is realized by the control operation of the CPU 101.

Figure 4:
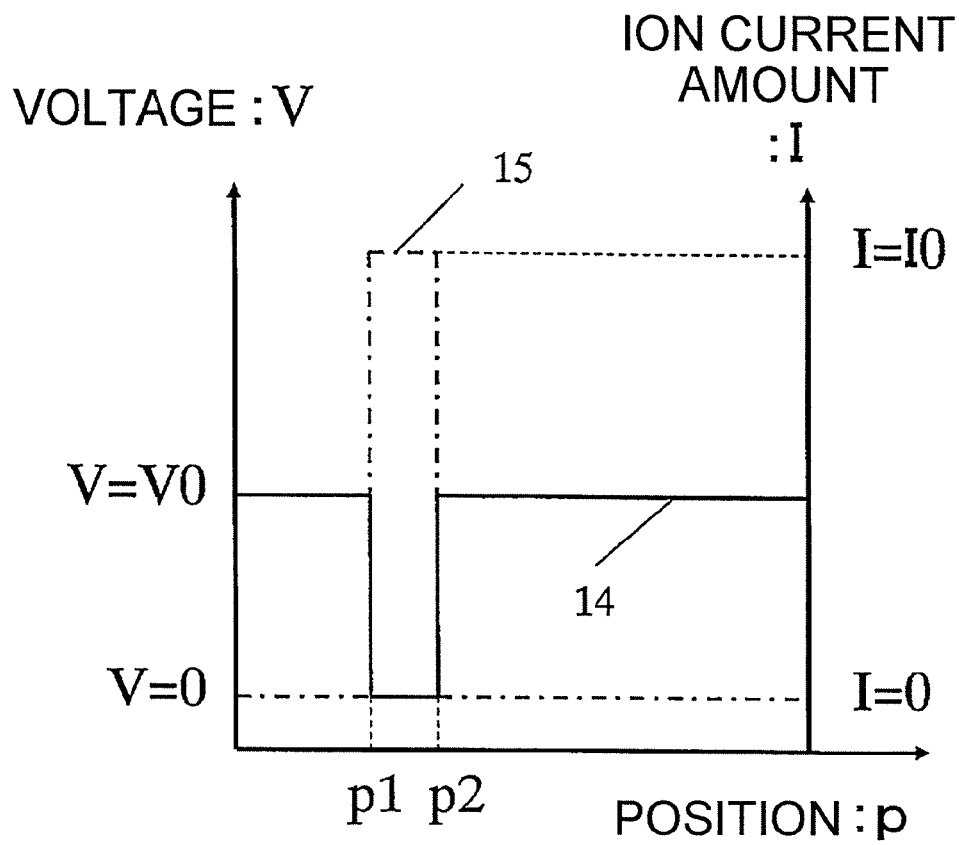
FIG. 4 is a diagram for illustrating control of ion implantation regions according to an embodiment of the present invention.

With reference to FIG. 4, a technique of creating the ion implantation region 11 in the partial ion implantation region 12 will be described. FIG. 4 shows a case in which one ion implantation region 11 is included in the partial ion implantation region 12. Since the ion implantation region 11 is set within a plane of the semiconductor wafer 9 as shown in, for example, FIG. 3, the ion implantation region 11 beginning from a position reaching another position may be created on positional coordinates of the scanning direction (the horizontal direction in FIG. 3) of an ion beam in one partial ion implantation region 12. In FIG. 4, the positions are respectively set to be p1 and p2. When only one ion implantation region 11 is included in the partial ion implantation region 12 as shown in FIG. 4, a non-ion-implantation region may be created in portions other than the positional coordinates from p1 to p2.

As will be described later in more detail, in certain embodiments of the present invention, during creation of the partial ion implantation region 12, reciprocating scanning using an ion beam is generally performed on the semiconductor wafer 9 plural times, but in FIG. 4, a case in which scanning is performed only in one direction is described in order to simplify description. As a direction of scanning using an ion beam, it is assumed in FIG. 4 that scanning is performed in the direction from p1 to p2.

In FIG. 4, in a left position of the position p1 on the semiconductor wafer 9, a non-ion-implantation region should be created. If scanning is just performed using an ion beam, the ion beam reaches the semiconductor wafer 9, ions are implanted into the semiconductor wafer 9, and accordingly, a non-ion-implantation region is not able to be created. In other words, in a left position of the position p1 on the semiconductor wafer 9, it is necessary not to cause ions to be implanted into the semiconductor wafer 9 while setting the beam scanner 6 of FIG. 1 to be able to perform beam scanning.

In certain embodiments of the present invention, by applying a voltage 14 (V=V0) to an electrode installed in a predetermined location of the ion conveyed region from the ion source 1 to the semiconductor wafer 9, ions are not allowed to be implanted into the semiconductor wafer 9 while setting the beam scanner 6 of FIG. 1 to be able to perform beam scanning. Since the electrode is one that does not allow ions to be implanted into the semiconductor wafer 9, it will be referred to as an ion implantation avoiding electrode. This type of an ion implantation avoiding electrode is realized by, for example, installing a pair of opposite electrodes so as to interpose an ion beam therebetween. In other words, the ion beam is deflected from its normal trajectory by applying a voltage to the pair of opposite electrodes so as to be incident to a target disposed at a location out of the trajectory. In this manner, the pair of opposite electrodes, i.e. the ion implantation avoiding electrode functions as a deflection electrode. The predetermined location in which the ion implantation avoiding electrode may be anywhere in the ion conveyed region from the ion source 1 to the semiconductor wafer 9, and may be in the upstream or downstream of the beam scanner 6. If the above operation is performed, an ion current amount (beam current amount) 15 on the semiconductor wafer 9 can be zero in a left position of the position p1 on the semiconductor wafer 9 in FIG. 4. This state can also be said that, while the beam scanner 6 virtually performs scanning using the ion beam on the semiconductor wafer 9, the ion beam actually does not reach the semiconductor wafer 9 due to application of the voltage 14 to the ion implantation avoiding electrode that is installed in the predetermined location of the ion conveyed region.

In FIG. 1, the ion implantation avoiding electrode 20 dedicated to avoidance of ion implantation is arranged on the upstream side of the mass spectrometry slit 4, in other words, between the mass spectrometry magnet device 3 and the mass spectrometry slit 4. However, with regard to the ion implantation avoiding electrode, an electrode that has already been disposed in the ion conveyed region from the ion source 1 to the semiconductor wafer 9 for another purpose may be used. Particularly, as already described in FIG. 1, the electrostatic lens 5 for an ion beam is arranged in the ion conveyed region from the ion source 1 to the semiconductor wafer 9. When the electrostatic lens 5 is present as above, an electrode of the electrostatic lens 5 may be used as the ion implantation avoiding electrode. Alternatively, an ion beam may be incident to a target arranged at a location deviated from the normal beam trajectory in such a way that the ion beam is over-scanned by the beam scanner 6. In such a case, cost required to realize certain embodiments of the present invention can be further reduced.

In certain embodiments of the present invention, at positional coordinates on the semiconductor wafer 9 decided in advance, the application of the voltage 14 to the ion implantation avoiding electrode is removed, and creation of the ion implantation region 11 is started. To use FIG. 4 as an example, when the position of virtual beam scanning by the beam scanner 6 reaches p1, the application of the voltage 14 to the ion implantation avoiding electrode is removed (the voltage 14 is zero). In this manner, as shown by the dashed line in FIG. 4, the ion current amount 15 on the semiconductor wafer 9 is a given value, which is I0 in FIG. 4 in the position p1 on the semiconductor wafer 9.

Herein, when the position of the virtual beam scanning by the beam scanner 6 reaches p1, the voltage 14 of the ion implantation avoiding electrode becomes zero. However, when an electrode that has already been disposed in the ion conveyed region from the ion source 1 to the semiconductor wafer 9 for another purpose is used as the ion implantation avoiding electrode, it is needless to say that the voltage 14 given for an object of certain embodiments of the present invention becomes zero, but the electrode given for other objects does not need to be zero. In FIG. 4 and thereafter, only the voltage 14 given for an object of certain embodiments of the present invention will be described.

In certain embodiments of the present invention, when the ion implantation region 11 is created, the application of the voltage 14 to the ion implantation avoiding electrode is removed, and scanning using the ion beam is performed while the ion beam is put in a state in which it actually reaches the semiconductor wafer 9. In other words, in FIG. 4, the voltage 14 applied to the ion implantation avoiding electrode continues to be zero between the positions p1 and p2. As a result, the ion current amount 15 on the semiconductor wafer 9 continues to be a given value, which is I0 in FIG. 4 between the positions p1 and p2 on the semiconductor wafer 9.

In certain embodiments of the present invention, the creation of the ion implantation region 11 is first finished by intentionally applying the voltage 14 to the ion implantation avoiding electrode and stopping ion beam radiation onto the semiconductor wafer 9 at the positional coordinates on the semiconductor wafer 9 decided in advance. To use FIG. 4 as an example, when the position of bean scanning by the beam scanner 6 reaches p2, the voltage 14 is applied to the ion implantation avoiding electrode again. In this manner, the ion current amount 15 on the semiconductor wafer 9 becomes zero in the position p2 on the semiconductor wafer 9, and can continue to be zero in a right position of the position p2 on the semiconductor wafer 9.

In certain embodiments of the present invention, it is possible to set the ion implantation region length in the scanning direction of the ion beam by appropriately changing the position in which the application of the voltage 14 to the ion implantation avoiding electrode is removed and the position in which the voltage 14 is intentionally applied to the ion implantation avoiding electrode and ion beam radiation onto the semiconductor wafer 9 is stopped. The minimum ion implantation region length is decided based on the beam width in the scanning direction of the ion beam, the application of a voltage to the ion implantation avoiding electrode and the removal speed thereof including a scanning frequency and a control command of the ion beam.

In certain embodiments of the present invention, an electromagnetic field lens which enable to control the beam width in the scanning direction of the ion beam to be the same as that in a direction orthogonal to the scanning direction of the ion beam in the range of 2 mm or longer and 80 mm or shorter. For this reason, if the effect of the application of a voltage to the ion implantation avoiding electrode and the removal speed thereof including a scanning frequency and a control command of the ion beam can be ignored, the minimum ion implantation region length of the ion implantation region 11 in the scanning direction of the ion beam can be 2 mm. Herein, with regard to the maximum ion implantation region length of the ion implantation region 11 in the scanning direction of the ion beam, there is no technical limit on the control range, but considering an object of certain embodiments of the present invention, the maximum ion implantation region length may set to be 80 mm. Thus, if the effect of the application of a voltage to the ion implantation avoiding electrode and the removal speed thereof including a scanning frequency and a control command of the ion beam can be ignored, the length of the ion implantation region 11 in the scanning direction of the ion beam can also be controlled in the range of 2 mm or longer and 80 mm or shorter. However, if a frequency of about 300 Hz that is generally used is used as the scanning frequency of the ion beam, the effect of the application of a voltage to the ion implantation avoiding electrode and the removal speed thereof including a scanning frequency and a control command of the ion beam cannot be ignored. Hereinafter, this will be described in detail.

The time from the start of voltage application to the end of the voltage application to the ion implantation avoiding electrode, or the time from the start of voltage removal to the end of the voltage removal depends also on the electric capacity of the ion implantation avoiding electrode, but does not exceed 100 μsec at most. On the other hand, a command time interval that regulates the frequency of control commands is about 1 msec in a control system that is used in a general ion implantation apparatus. A control system having a shorter interval is technically possible, but cost increases, and accordingly, such a system cannot be employed in reality. Thus, it is necessary to estimate the application of a voltage to the ion implantation avoiding electrode and the removal speed thereof including a control command to be 1 msec. If the scanning frequency of the ion beam is set to be about 300 Hz that is well used, the ion beam moves at least 100 mm or further on the semiconductor wafer for the time from the start of the voltage application to the end of the voltage application to the ion implantation avoiding electrode including a control command, or for the time from the start of the voltage removal to the end of the voltage removal. This means that an intended ion implantation region 11 is not able to be created within the partial ion implantation region 12.

In order to have an error in the ion beam movement to the extent that the effect of the application of a voltage to the ion implantation avoiding electrode and the removal speed thereof including a scanning frequency and a control command of the ion beam can be ignored while the command time interval of about 1 msec is maintained, the amount of an ion beam movement for the time from the start of the voltage application to the end of the voltage application to the ion implantation avoiding electrode including the control command, or for the time from the start of the voltage removal to the end of the voltage removal may be about ⅕ of the minimum ion implantation region length, that is, about 0.4 mm. In order to satisfy this condition, the scanning frequency of the ion beam may set to be 1 Hz or lower. Thus, in certain embodiments of the present invention, as the scanning frequency of the ion beam during ion implantation into the wafer plane, the scanning frequency of 1 Hz or lower is used.

With the above-described configuration, an ion implantation region length in the scanning direction of an ion beam and an ion implantation region length of a direction orthogonal to the scanning direction of the ion beam can be set in the range of 2 mm or longer and 80 mm or shorter.

Figure 5:
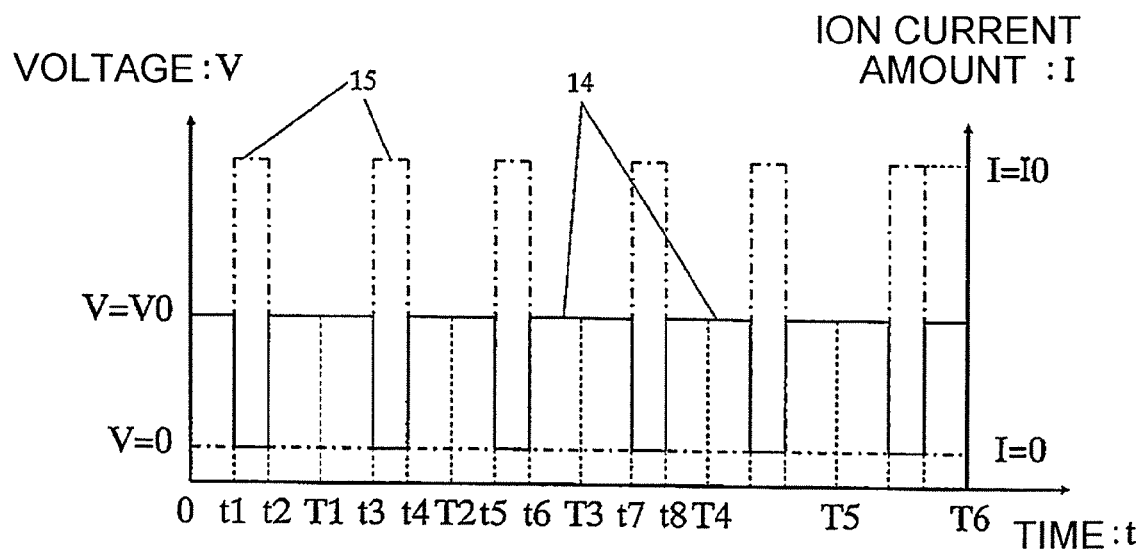
FIG. 5 is a diagram for illustrating control of ion implantation regions according to an embodiment of the present invention.

With reference to FIG. 5, the method for creating the ion implantation region 11 will be described in more detail. FIG. 5 also shows a case in which one ion implantation region 11 is included in the partial ion implantation region 12. From now on, description will be provided by setting the scanning range of an ion beam to be L (m) and the scanning frequency of the ion beam to be F (Hz). Herein, it is set that beam scanning using an ion beam is started at a time T=0 (sec), one-way beam scanning ends at T=T1 (sec), and reciprocating beam scanning ends at T=T2 (sec). In this case, T1=1/2F (sec), and T2=1/F (sec). In addition, the scanning speed of the ion beam is L/T1=2LF (m/sec).

In addition, as described in FIG. 4, the ion implantation region 11 is assumed to be created between the position p1 (m) and the position p2 (m) based on a scanning start position. Herein, in first progressing beam scanning, the application of the voltage 14 to the ion implantation avoiding electrode is removed at t1=p1/2LF (sec), and accordingly, the ion current amount 15 on the semiconductor wafer 9 is set to be I0. Next, by intentionally applying the voltage 14 to the ion implantation avoiding electrode and stopping ion beam radiation onto the semiconductor wafer 9 at t2=p2/2LF (sec), the ion current amount 15 on the semiconductor wafer 9 is set to be zero.

In first returning beam scanning, the application of the voltage 14 to the ion implantation avoiding electrode is removed at t3=(2L−p2)/2LF (sec), and accordingly, the ion current amount 15 on the semiconductor wafer 9 is set to be I0. Next, by intentionally applying the voltage 14 to the ion implantation avoiding electrode and stopping the ion beam radiation onto the semiconductor wafer 9 at t4=(2L−p1)/2LF (sec), the ion current amount 15 on the semiconductor wafer 9 is set to be zero.

Hereinafter, in second progressing beam scanning, the application of the voltage 14 to the ion implantation avoiding electrode is removed at t5=T2+p1/2LF (sec), and accordingly, the ion current amount 15 on the semiconductor wafer 9 is set to be I0. Next, by intentionally applying the voltage 14 to the ion implantation avoiding electrode and stopping the ion beam radiation onto the semiconductor wafer 9 at t6=T2+p2/2LF (sec), the ion current amount 15 on the semiconductor wafer 9 is set to be zero. In addition, in second returning beam scanning, the application of the voltage 14 to the ion implantation avoiding electrode is removed at t7=T2+(2L−p2)/2LF (sec), and accordingly, the ion current amount 15 on the semiconductor wafer 9 is set to be I0. Next, by intentionally applying the voltage 14 to the ion implantation avoiding electrode and stopping the ion beam radiation onto the semiconductor wafer 9 at t8=T2+(2L−p1)/2LF (sec), the ion current amount 15 on the semiconductor wafer 9 is set to be zero. Note that, it is needless to say that the second progressing scanning ends at T=T3 (sec) and the second returning scanning ends at T=T4 (sec).

By repeating the above operation, ions are implanted only into target positions on the semiconductor wafer 9, whereby the ion implantation region 11 can be created. As obvious from FIG. 5, the dose of ions to be implanted into the ion implantation region 11 is proportional to the ion current amount 15 and the number of scanning times of the ion beam. In other words, the ion current amount 15 is measured and then the necessary number of scanning times of the ion beam is obtained from calculation based on the measured ion current amount 15 and set dose of the ion implantation region 11. Then, by performing scanning in the partial ion implantation region 12 by the number of beam scanning times with the semiconductor wafer fixed, the set dose of the ion implantation region 11 can be realized.

Note that, as obvious from the above description, when reciprocating scanning is set to be a basic unit, the number of beam scanning times may not necessarily be an integer, but may be a half-integer. In this case, the final beam scanning is performed in a progressing manner.

Herein, in a general ion implantation apparatus in which ions generated in the ion source 1 are conveyed to the semiconductor wafer 9 as an ion beam and reciprocating scanning in a uniaxial direction using the ion beam is performed in the middle of the ion conveyed region, a frequency of about 300 Hz is well used as a scanning frequency of the ion beam as already described. For this reason, in such a general ion implantation apparatus, in order to control the dose for the semiconductor wafer 9, an ion beam implantation time into the semiconductor wafer 9 is used, or a mechanical speed when scanning (moving) is continuously mechanically performed for the semiconductor wafer 9 in a direction orthogonal to the scanning direction of the ion beam is used, without directly setting the number of ion beam scanning times. In certain embodiments of the present invention, since ions are implanted by fixing the semiconductor wafer 9 during the creation of the partial ion implantation region 12, it is difficult to use the mechanical speed of the semiconductor wafer 9. If the ion beam implantation time into the semiconductor wafer 9 is used, an implantation end command may be issued during ion implantation into the semiconductor wafer 9 in the scanning direction of the ion beam due to an error in calculating the time. Since the semiconductor wafer 9 is normally scanned (moved) in a mechanical and consecutive manner in the direction orthogonal to the scanning direction of the ion beam, even when an implantation end command is formally issued during ion implantation into the semiconductor wafer 9 in the scanning direction of the ion beam, the ion beam exits the semiconductor wafer 9 in the direction orthogonal to the scanning direction of the ion beam, which does not cause a problem. However, in certain embodiments of the present invention, since ion implantation is performed by fixing the semiconductor wafer 9 during the creation of the partial ion implantation region 12, a case, in which the implantation end command is actually issued during ion implantation into the semiconductor wafer 9 due to an error in calculating the ion beam implantation time, and accordingly, necessary ion implantation is not attained, is assumed.

Thus, in certain embodiments of the present invention, the dose of the ion implantation region 11 is directly controlled based on the number of scanning times of the ion beam. In other words, it can be said that direct control of the dose of the ion implantation region 11 based on the number of scanning times of the ion beam is one of the characteristics of certain embodiments of the present invention.

In order to make the control accuracy in a dose the same as that in a general ion implantation method when the dose of the ion implantation region 11 is directly controlled based on the number of scanning times of the ion beam in this manner, it is necessary to put a slight limit on a set value of the implantation dose. If the control accuracy of a dose is assumed to be 1%, for example, it is necessary to secure 100 beam scanning times. In order to increase the number of beam scanning times at a given dose, it is necessary to reduce the ion current amount 15 on the semiconductor wafer 9, but there is a limit on the minimum value of the ion current amount 15 due to the limit on hardware control of an ion implantation apparatus. In an ion implantation apparatus using a scanning frequency of about 300 Hz, the minimum dose is about $1E11/cm^2$. In certain embodiments of the present invention, according to research of the control of a minimum value of the ion current amount 15, scanning frequencies differ in two or more digits, but the minimum dose can be set to be $1E13/cm^2$. There is no technical limit on a maximum dose in certain embodiments of the present invention as described above, but considering an object of certain embodiments of the present invention, the maximum dose may be $1E17/cm^2$. In other words, in certain embodiments of the present invention, a dose of the ion implantation region 11 can be set to be $1E13/cm^2$ or more and $1E17/cm^2$ or less.

As already described, since a dose of the ion implantation region 11 can be controlled by setting the number of scanning times of an ion beam, by changing the number of beam scanning times of each partial ion implantation region 12, the dose of the ion implantation region 11 can be respectively controlled, and a plurality of types of the ion implantation regions 11 can also be created within a plane of the semiconductor wafer 9. In other words, performing the beam scanning a plurality of beam scanning times set for each partial ion implantation region 12 with the semiconductor wafer fixed in accordance with the plurality of types of ion implantation regions 11 having different doses set within the plane of the semiconductor wafer 9 can also be said as one of the characteristics of certain embodiments of the present invention.

Figure 6:
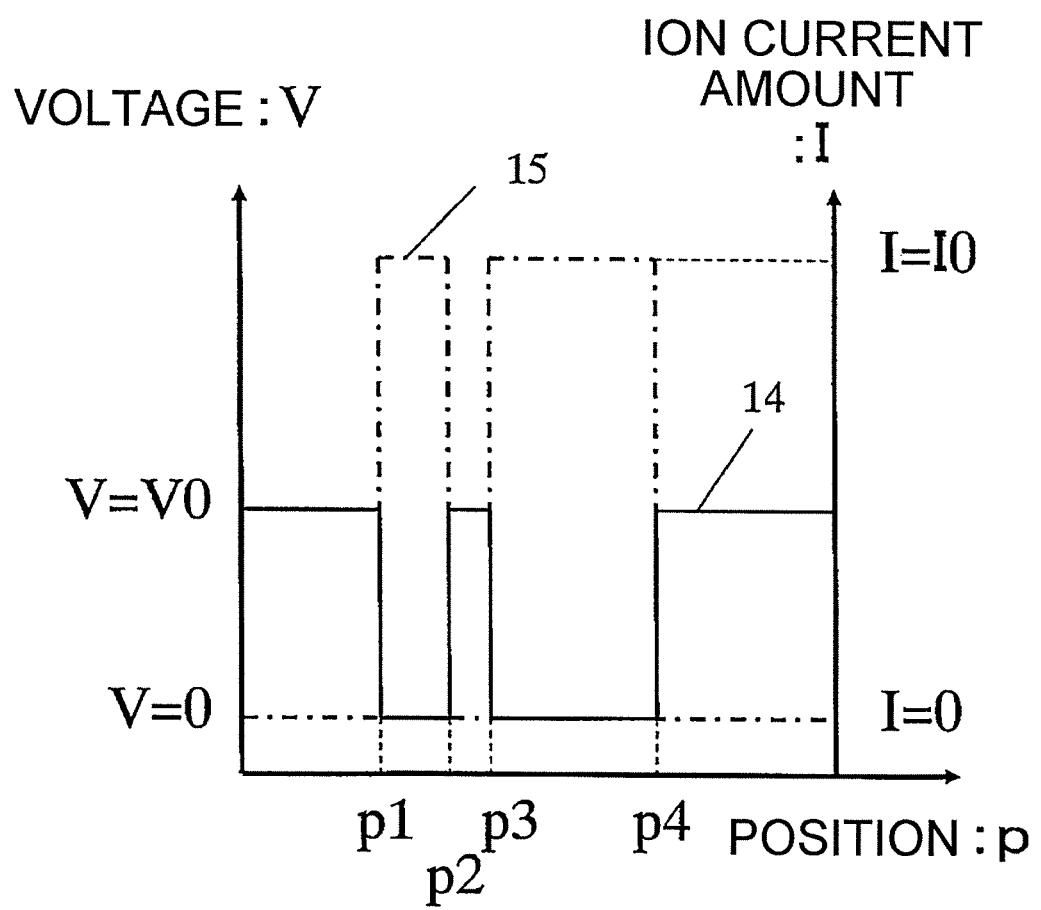
FIG. 6 is a diagram for illustrating control of ion implantation regions according to an embodiment of the present invention.

In FIGS. 4 and 5, the case in which one ion implantation regions 11 is included in the partial ion implantation region 12 has been described. Next, with reference to FIG. 6, a case in which a plurality of ion implantation regions 11 are included in the partial ion implantation region 12 will be described. As already described, since the ion implantation regions 11 are set within a plane of the semiconductor wafer 9, for example, as shown in FIG. 3, the ion implantation regions 11 that expand from a given position to another given position may be created in positional coordinates of the scanning direction (the horizontal direction in FIG. 3) of an ion beam in one partial ion implantation region 12. In FIG. 6, an ion implantation region 11 that expands from the position p1 to the position p2, and another ion implantation region 11 that expands from a position p3 and a position p4. In the range other than the portions, a non-ion-implantation region may be created. As already described using FIG. 5, in certain embodiments of the present invention, reciprocating scanning using an ion beam is generally performed plural times on the semiconductor wafer 9 during the creation of the partial ion implantation region 12, but in FIG. 6, description will be provided for the case of one-way scanning for the sake of simple description. The direction of scanning of an ion beam is set to be the direction from p1 to p2 in FIG. 6.

In the same manner as described in FIG. 4, it is necessary for ions not to be implanted into the semiconductor wafer 9 in the non-ion-implantation region of FIG. 6 while setting the beam scanner 6 of FIG. 1 to be able to perform beam scanning. Thus, as already described using FIG. 4, by applying the voltage 14 to the ion implantation avoiding electrode, ions are not implanted into the semiconductor wafer 9 even when the beam scanner 6 of FIG. 1 is set to be able to perform beam scanning.

Also for a technique of creating the ion implantation regions 11 of FIG. 6, the technique already described in FIG. 4 may apply. In other words, when a position of virtual beam scanning by the beam scanner 6 reaches p1, application of the voltage 14 to the ion implantation avoiding electrode is removed, and creation of the ion implantation regions 11 is started. Between the positions p1 and p2, the creation of the ion implantation regions 11 continues by continuously setting the voltage 14 applied to the ion implantation avoiding electrode to be zero. Next, when the position of beam scanning by the beam scanner 6 reaches p2, by applying the voltage 14 to the ion implantation avoiding electrode again and stopping ion beam radiation onto the semiconductor wafer 9, the creation of the ion implantation regions 11 ends first. In the same manner, when the position of virtual beam scanning by the beam scanner 6 reaches p3, the application of the voltage 14 to the ion implantation avoiding electrode is removed and the creation of the ion implantation regions 11 is started. Between the positions p3 and p4, the creation of the ion implantation regions 11 continues by continuously setting the voltage 14 applied to the ion implantation avoiding electrode to be zero. Next, when the position of beam scanning by the beam scanner 6 reaches p4, by applying the voltage 14 to the ion implantation avoiding electrode again and stopping ion beam radiation onto the semiconductor wafer 9, the creation of the ion implantation regions 11 ends first. In this case, the ion current amount 15 on the semiconductor wafer 9 is a certain value between the positions p1 and p2 and the positions p3 and p4, which is I0 in FIG. 6, and is zero in a position other than the positions (between the positions p1 and p2 and between the positions p3 and p4).

Then, by repeating the operation described using FIG. 5, ions are implanted only into target positions on the semiconductor wafer 9, whereby the ion implantation regions 11 can be created. In addition, in the same manner as described using FIG. 5, set doses of the ion implantation regions 11 can be realized in such a way that the ion current amount 15 is measured, the necessary number of scanning times using an ion beam is obtained from calculation based on the measured ion current amount 15 and set doses of the ion implantation regions 11, and scanning using the ion beam is performed the number of beam scanning times in the partial ion implantation region 12 with the semiconductor wafer fixed.

As obvious from description of FIGS. 4 and 6, the ion implantation region length in the scanning direction of the ion beam can be set in the range of 2 mm or longer and 80 mm or shorter also using the technique of creating the ion implantation regions 11 described in FIG. 6. In addition to that, it is also obvious that creating the ion implantation regions 11 having different ion implantation region lengths in the scanning direction of the ion beam in one partial ion implantation region 12 is possible.

In addition, as obvious from FIG. 6, if certain embodiments of the present invention are used, it is configured that a plurality of ion implantation regions 11 are present in one partial ion implantation region 12, and each of the ion implantation region 11 is separated by non-ion-implantation regions.

Further, as obvious from FIGS. 5 and 6, by variously changing patterns of times in which the voltage is intentionally applied or times in which the voltage is removed, a plurality of ion implantation regions 11 having different ion implantation region lengths in the scanning direction of the ion beam can be created within the plane of the semiconductor wafer 9.

In addition, electromagnetic force given to the ion beam according to certain embodiments of the present invention is just force generated by applying the voltage 14 to the ion implantation avoiding electrode, and during the creation of the ion implantation regions 11, the voltage application is also removed. As already described using FIG. 1, in certain embodiments of the present invention, a constituent element of a one-dimensional paralleling beam line that is called the parallel lens 7 to maintain implantation angles of an ion beam with the semiconductor wafer 9 to be even within a wafer plane is disposed in the ion conveyed region from the ion source 1 to the semiconductor wafer 9. Thus, ion beams incident to the semiconductor wafer 9 when the ion implantation regions 11 are created are parallel with each other at any position. In other words, ion implantation angles according to certain embodiments of the present invention, i.e. ion implantation angles within a wafer plane in the ion implantation regions 11 set in plural number in one partial ion implantation region 12 can be parallel to each other even in any of the ion implantation regions 11.

The above-described characteristic of the ion implantation regions is significantly different from that in the technique of the related art already described. In other words, as already described, in the technique of the related art, it is necessary to two-dimensionally perform scanning using an ion beam, and the ion implantation angles within a wafer plane are difficult to be uniform. Thus, in the technique of the related art, when ion implantation regions 11 are scattered within a wafer plane, the ion implantation angles of each of the ion implantation regions 11 are not uniform.

On the other hand, according to certain embodiments of the present invention, as already described, ion implantation angles for a wafer plane in the ion implantation regions 11 set in plural number in one partial ion implantation region 12 can be parallel to each other in any of the ion implantation regions 11. The characteristic of certain embodiments of the present invention with regard to the ion implantation angles will be described later in detail, but is the same even when the ion implantation regions 11 are scattered within a wafer plane.

To summarize the description regarding the ion implantation regions 11 hereinabove, in certain embodiments of the present invention, the ion implantation region length in the scanning direction of an ion beam can be set in the range of 2 mm or longer and 80 mm or shorter, and the ion implantation region length in a direction orthogonal to the scanning direction of the ion beam also can be set in the range of 2 mm or longer and 80 mm or shorter. In addition, a dose of the ion implantation region 11 can be set in the range of $1E13/cm^2$ or more and $1E17/cm^2$ or less. Further, according to certain embodiments of the present invention, within a plane of the semiconductor wafer 9, a plurality of types of ion implantation regions 11 having different ion implantation region lengths in the scanning direction of an ion beam or in a direction orthogonal to the scanning direction of the ion beam can be created, or a plurality of types of ion implantation regions 11 having different doses can be created.

In order to variously control the ion implantation regions 11, the certain embodiments of present invention retain a plurality of types of patterns of times in which a voltage is intentionally applied to the ion implantation avoiding electrode or times in which the voltage is removed during ion implantation into one semiconductor wafer 9, and this point can also be said to be one of the characteristics of certain embodiments of the present invention.

Figure 7:
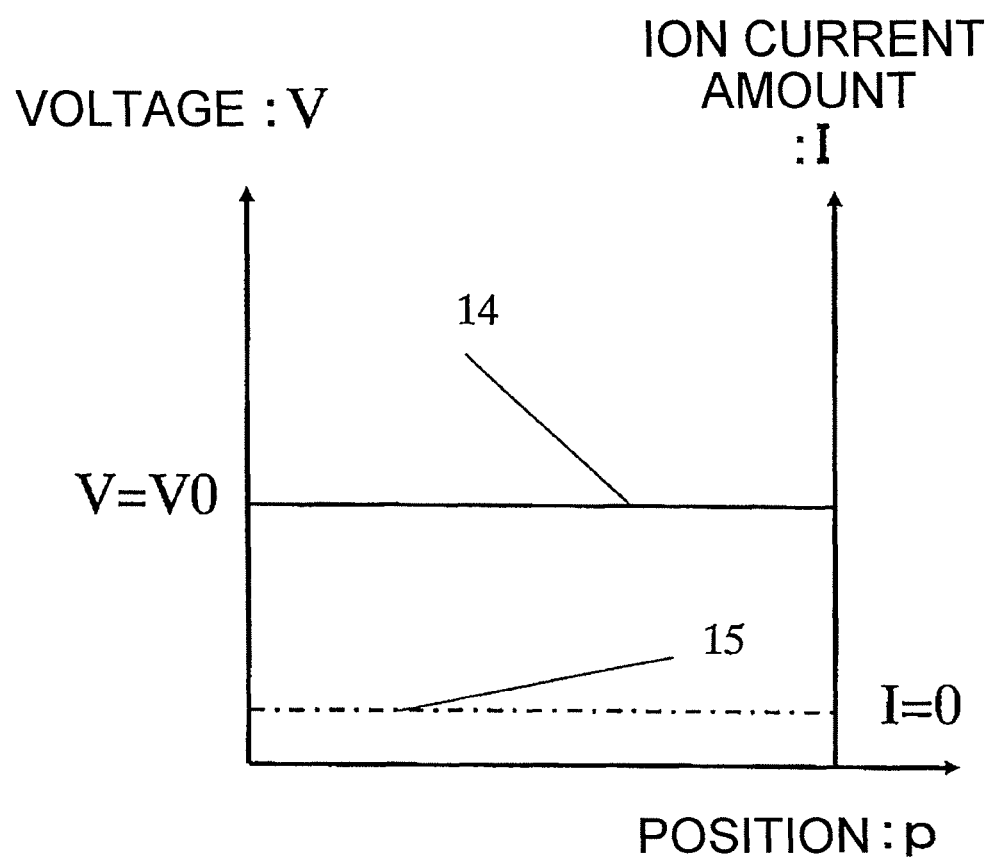
FIG. 7 is a diagram for illustrating control of non-ion-implantation regions according to an embodiment of the present invention.

With reference to FIG. 7, a technique of creating the full-width non-ion-implantation region 13 (of FIG. 3) according to an embodiment of the present invention will be described. Since an ion beam may not reach the semiconductor wafer 9 in the full-width non-ion-implantation region 13, generally various techniques can be considered, but in certain embodiments of the present invention, the technique of creating the partial ion implantation region 12 should also be considered. In other words, creating a plurality of types of ion implantation regions 11 having different doses within a plane of the semiconductor wafer 9 in one time of a series of ion implantations is an object of certain embodiments of the present invention, the technique of creating the full-width non-ion-implantation region 13 should also meet the object. To this end, when the full-width non-ion-implantation region 13 is created, it is necessary that ions are not implanted into the semiconductor wafer 9 while setting the beam scanner 6 of FIG. 1 to be able to perform beam scanning. Thus, it is desirable to take the same technique as that of creating a non-ion-implantation region in the partial ion implantation region 12 described above.

Thus, in certain embodiments of the present invention, the ion current amount 15 on the semiconductor wafer 9 is set to be zero by applying the voltage 14 to the ion implantation avoiding electrode even when the full-width non-ion-implantation region 13 is created. As already described, this state can be said that, while scanning is virtually performed using an ion beam on the semiconductor wafer 9 by the beam scanner 6, the ion beam does not actually reach the semiconductor wafer 9 due to the application of the voltage 14 to the ion implantation avoiding electrode.

Herein, there is a significant difference between the behavior of the ion implantation apparatus during the creation of the partial ion implantation region 12 and during the creation of the full-width non-ion-implantation region 13 according to certain embodiments of the present invention. As already described, in certain embodiments of the present invention, in order to control the length of the ion implantation region 11 in a direction orthogonal to the scanning direction of an ion beam in the ion implantation region included in the partial ion implantation region 12 during the creation thereof, the beam width in a direction orthogonal to the scanning direction of a scanned ion beam is controlled in accordance with the length of the ion implantation region 11 in the direction orthogonal to the scanning direction of the ion beam therein, and ions are implanted by fixing the semiconductor wafer 9 in this state. In other words, the reason for fixing the semiconductor wafer 9 is to control the length of the ion implantation region 11 in the direction orthogonal to the scanning direction of the ion beam therein, and fixing of the semiconductor wafer 9 is not necessary during the creation of the full-width non-ion-implantation region 13. Thus, during the creation of the full-width non-ion-implantation region 13, the semiconductor wafer 9 is moved to the direction orthogonal to the scanning direction of the ion beam.

As already described in FIG. 3, since the partial ion implantation regions 12 and the full-width non-ion-implantation regions 13 repeatedly appear in an alternate manner, the movement of the semiconductor wafer 9 in the direction orthogonal to the scanning direction of the ion beam during the creation of the full-width non-ion-implantation regions 13 is performed until the creation of the next partial ion implantation region 12 is started, and during the creation of the following partial ion implantation regions 12, the semiconductor wafer 9 is fixed. Thus, to summarize an operation of the ion implantation apparatus according to certain embodiments of the present invention, ions are implanted by fixing the semiconductor wafer during the creation of the partial ion implantation regions 12, and during the creation of the full-width non-ion-implantation regions 13, ion implantation is not performed, but the semiconductor wafer is moved and the fixing and the movement of the wafer are repeated plural times.

In other words, in an ion implantation method of certain embodiments of the present invention in which ions are implanted in only desired positions within a plane of the semiconductor wafer 9 and ions are not implanted in positions other than the desired position, two types of in-plane regions which are alternately arranged more than one time, i.e. the partial ion implantation regions 12 and the full-width non-ion-implantation regions 13 are set in the wafer plane in the direction orthogonal to the scanning direction of the ion beam, and different ion processing methods are performed in each of the in-plane regions.

Hereinabove, the behavior of the ion implantation apparatus during ion implantation into the semiconductor wafer 9 according to certain embodiments of the present invention has been described, but with regard to details other than the control accuracy in doses that has been already described, there is no difference from the ion implantation apparatus generally used. Thus, it is obvious that, by arranging a constituent element on one-dimensional paralleling beam line, that is, the parallel lens 7 that maintains implantation angles of an ion beam for the semiconductor wafer 9 to be uniform within a plane of the semiconductor wafer 9 in the ion conveyed region from the ion source 1 to the semiconductor wafer 9, which has already been described using FIG. 1, the ion implantation performance of ion implantation regions, in other words, control accuracy in ion energy, ion implantation angles, and doses can be set to be the same level as in the general ion implantation method.

Particularly, to add just to be sure with regard to the ion implantation angles, as already described, the ion implantation angles to the wafer plane in the ion implantation regions 11 that are set in plural in one partial ion implantation region 12 according to certain embodiments of the present invention can be parallel to one another in any of the ion implantation regions. Further, when ion implantation angles to the wafer plane in the ion implantation regions 11 set in a plurality of partial ion implantation regions 12 are considered, in the ion implantation apparatus according to certain embodiments of the present invention, movement or fixing of the semiconductor wafer 9 is merely performed once or plural times, and a mechanical operation of changing the ion implantation angles is not present during implantation of an ion beam into the ion implantation regions 11. Thus, the ion implantation angles to the wafer plane in the ion implantation regions 11 set in the plurality of partial ion implantation regions 12 can also be parallel to one another in any of the ion implantation regions.

To summarize, even when the ion implantation regions 11 are scattered in a plane of the semiconductor wafer 9, the ion implantation angles in each of the ion implantation regions 11 can be set to be uniform according to certain embodiments of the present invention.

As already described, as it is necessary to perform two-dimensional scanning using an ion beam and it is difficult to set ion implantation angles to a wafer plane to be uniform, in the technique of the related art in which such two-dimensional scanning using an ion beam is used, when the ion implantation regions 11 are scattered in the wafer plane, the ion implantation angles in each of the ion implantation regions 11 are not uniform. In comparison, the ion implantation angles can be uniform in any region of the semiconductor wafer according to certain embodiments of the present invention, which can be said as one of the characteristics of certain embodiments of the present invention that is significantly different from the technique of the related art.

In addition, with regard to the external environment during ion implantation, there is no difference between certain embodiments of the present invention and an ion implantation apparatus generally used. Particularly, in certain embodiments of the present invention, the ion implantation regions 11 and non-ion-implantation regions are created without using an object of a mask shape such as a resist mask, a stencil mask, or a movable mask. Accordingly, the level of metal contamination, the level of cross contamination, the level of ion energy contamination, and the level of the number of particles deriving from the object of a mask shape are the same as those in the general ion implantation method.

Hitherto, an operation of certain embodiments of the present invention when the ion implantation regions 11 and non-ion-implantation regions are created in the semiconductor wafer 9 has been described, but herein, preparation before ion implantation is performed on the semiconductor wafer 9 will be described.

In certain embodiments of the present invention, before ion implantation is performed on the semiconductor wafer 9, it is necessary to measure the beam width in the direction orthogonal to the scanning direction of a scanned ion beam and the ion current amount 15. The reason for measuring the beam width in the direction orthogonal to the scanning direction of the scanned ion beam is to control the length of the ion implantation regions 11 in the direction orthogonal to the scanning direction of an ion beam as already described. In addition, the reason for measuring the ion current amount 15 is, as already described, to obtain the necessary number of scanning times of an ion beam from calculation based on the measured ion current amount 15 and set doses of the ion implantation regions 11 so as to control the doses of the ion implantation regions 11.

As already described, when ion implantation is executed according to certain embodiments of the present invention, a scanning frequency of 1 Hz or lower is used as the scanning frequency of an ion beam during the ion implantation into a wafer plane. This scanning frequency is essential for ion implantation according to certain embodiments of the present invention, and cannot be changed.

Herein, when the same scanning frequency as that of an ion beam during ion implantation into a wafer plane is used as a scanning frequency of an ion beam during measurement of the beam width in the direction orthogonal to the scanning direction of a scanned ion beam before ion implantation is performed on the semiconductor wafer 9 and during measurement of the ion current amount 15 of which the current passes through a unit area in a unit time (hereinafter, referred to as during the set-up measurement), the time required during the set-up measurement is lengthened. When the scanning frequency of the ion beam is 1 Hz, for example, 500 msec is required at most for the ion beam passing through the diameter of the semiconductor wafer 9. This value is very high in comparison to the time required for the ion beam passing through the diameter of the semiconductor wafer 9, that is, 2 msec, when a scanning frequency of about 300 Hz, which is well used in a general ion implantation apparatus, is used as the scanning frequency of the ion beam.

During the set-up measurement, the beam width and the ion current amount 15 are measured using the wafer region beam measurement device 8 shown in FIG. 1, but in this case, it is necessary to perform the measurement by actually performing scanning with an ion beam using the beam scanner 6. In other words, if the same scanning frequency as that of the ion beam during the ion implantation into a wafer plane is used as a scanning frequency of the ion beam during the set-up measurement, the time necessary for scanning is lengthened.

Herein, it is not necessary to use the same scanning frequency as that of the ion beam during the ion implantation into the wafer plane as a scanning frequency of the ion beam during the set-up measurement. In other words, the upper limit of the scanning frequency of the ion beam during the ion implantation into the wafer plane is essential for the ion implantation according to certain embodiments of the present invention, and cannot be changed as already described. However, if the scanning frequency of the ion beam during the set-up measurement enables correct measurement of the beam width and the ion current amount 15, it is not necessary to use the same scanning frequency as that of the ion beam during ion implantation into the wafer plane.

Herein, in an ion implantation apparatus in which ions generated in the ion source 1 are conveyed to the semiconductor wafer 9 as an ion beam, reciprocating scanning in a uniaxial direction using the ion beam can be performed in the middle of the conveyance, and the wafer can be moved in a direction orthogonal to the scanning direction of the ion beam, if the beam scanner 6 is designed or set so as not to change the quality of the ion beam even when a beam scanning frequency is changed, a scanning frequency of the ion beam during the set-up measurement may not be the same as that of the ion beam during ion implantation into a wafer plane. In other words, in an ion implantation apparatus which performs scanning using an ion beam, an electrostatic field or a magnetostatic field caused by the beam scanner 6 may be considered to affect the ion beam at a temporal moment, and thus, the scanning frequency of the ion beam merely changes the time axis. Thus, the quality of the ion beam can be controlled so as not to be dependent on the scanning frequency.

As obvious from the above description, if the beam scanner 6 is appropriately designed or appropriately set, the beam width and the ion current amount 15 can be correctly measured even when the scanning frequency of the ion beam during the set-up measurement is changed from the scanning frequency of the ion beam during ion implantation into a wafer plane. Specifically, in certain embodiments of the present invention, the scanning frequency of the ion beam during the set-up measurement can be increase 40 times that of the ion beam during ion implantation into the wafer plane. In specific, by using the scanning frequency of 40 Hz or higher, the time necessary for preparing ion implantation according to certain embodiments of the present invention is set to be the same as that for general ion implantation. This point is also one of the characteristics of certain embodiments of the present invention.

In addition, as already described, the scanning frequency of the ion beam during ion implantation into the wafer plane is 1 Hz or lower. In other words, it is needless to say that the scanning frequency of the ion beam at the time of measuring the ion beam before ion implantation into the wafer plane performed to measure the beam width in the direction orthogonal to the scanning direction of the scanned ion beam and the beam current amount of which the beam passes through a unit area in a unit time is different from the scanning frequency of the ion beam during ion implantation into the wafer plane. Such a change in scanning frequencies is very useful in terms of securing productivity of the semiconductor wafer 9 to apply certain embodiments of the present invention to an actual semiconductor manufacturing process. Thus, this point is also one of the characteristics of certain embodiments of the present invention.

Further, though already described, certain embodiments of in the present invention, the necessary number of beam scanning times is obtained from calculation based on the ion current amount 15 measured during the set-up measurement and set doses of the ion implantation regions 11, and scanning of the ion beam is performed by the number of beam scanning times with the semiconductor wafer fixed in the partial ion implantation regions 12, and thereby realizing the set doses of the ion implantation regions 11.

In addition, though the following point has already been described, in certain embodiments of the present invention, by employing the ion implantation method in which scanning of the ion beam is performed with the semiconductor wafer 9 fixed by a plurality of beam scanning times each of which is set in accordance with a plurality of types of ion implantation regions 11 having different doses set within a plane of the semiconductor wafer 9 in each partial ion implantation region 12 with regard to the doses of the ion implantation regions 11, the plurality of types of ion implantation regions 11 having different doses are created within the plane of the semiconductor wafer 9.

Note that, as obvious from the above description, certain embodiments of the present invention do not have a difference from a general ion implantation apparatus except for control of doses. Though already described using FIG. 1, the ion implantation apparatus of certain embodiments of the present invention has many common portions in hardware configuration to a hybrid scan ion implantation apparatus that is well used as a general ion implantation apparatus. For this reason, if the wafer holding device 10 used in certain embodiments of the present invention is configured to have the function required in the hybrid scan ion implantation apparatus, it is obvious that the ion implantation apparatus of certain embodiments of the present invention and the hybrid scan ion implantation apparatus can be realized by the same hardware.

Hitherto, at least one exemplary embodiment has been described, but the above description is a mere example, and does not intent to be a limitation.

It should be understood that the invention is not limited to the above-described embodiment, but may be modified into various forms on the basis of the spirit of the invention. Additionally, the modifications are included in the scope of the invention.

What is claimed is:

1. An ion implantation method using an ion implantation apparatus, the method comprising:
   conveying ions generated in an ion source to a wafer as an ion beam to implant ions to the wafer;
   performing a reciprocating scanning using the ion beam in a scanning direction of an uniaxial direction in the middle of the conveyance, the scanned ion beam being configured to be deflected so as to be parallelized in the same direction, and the wafer being configured to be moved to a direction orthogonal to the scanning direction of the ion beam; and setting two types of in-plane regions on a wafer plane, wherein the two types of in-plane regions are alternately arranged at least once in a direction orthogonal to the scanning direction of the ion beam, wherein one of the two types represents full-width non-ion-implantation regions into which ions are not implanted over entire widths of the in-plane regions, and the other type of the two types represents partial ion implantation regions comprising first regions with ions implanted and second regions with no ions implanted, the first and second regions being alternately repeated in the scanning direction of the ion beam, and wherein, in each of the two types of the in-plane regions, ions are implanted only into predetermined regions within the wafer plane and ions are not implanted in regions other than the predetermined regions by performing ion implantation processes under different conditions.

2. The ion implantation method according to claim 1, wherein, when the partial ion implantation regions are created, ion implantation is performed by fixing the wafer, and wherein, when the full-width non-ion-implantation regions are created, the wafer is moved without performing ion implantation, and fixing and movement of the wafer are repeated multiple times.

3. The ion implantation method according to claim 2, wherein ion implantation angles to the wafer plane in the plural ion implantation regions set in one of the partial ion implantation regions are parallel with one another in any of the ion implantation regions.

4. The ion implantation method according to claim 2, wherein ion implantation angles to the wafer plane in the ion implantation regions set in the plurality of partial ion implantation regions are parallel with one another in any of the ion implantation regions.

5. The ion implantation method according to claim 3, wherein the number of scanning times of the ion beam is determined based on set doses of the ion implantation regions and a beam current value measured in advance before ion implantation into the wafer is performed, and wherein the set doses of the ion implantation regions are realized by performing scanning of the ion beam the number of scanning times in the partial ion implantation regions with the wafer being fixed.

6. The ion implantation method according to claim 5, wherein the number of scanning times of the ion beam is an integer or a half-integer when the reciprocating scanning is set to be a basic unit.

7. The ion implantation method according to claim 1, wherein, when the full-width non-ion-implantation regions are to be created, ion beam radiation onto the wafer is stopped such that a trajectory of the ion beam is deflected by applying a voltage to an electrode that is installed in a predetermined location of an ion conveyed region from the ion source to the wafer.

8. The ion implantation method according to claim 1, further comprising:

installing an electrode for deflecting a trajectory of the ion beam in a predetermined location of an ion conveyed region from the ion source to the wafer;

when the partial ion implantation regions are to be created, stopping ion beam radiation onto the wafer such that a voltage application to the electrode is removed at positional coordinates identified in advance on the wafer when the creation of the ion implantation regions is started, and the voltage is applied to the electrode at positional coordinates on the wafer identified separately when the creation of the ion implantation regions ends.

9. The ion implantation method according to claim 1, wherein, during ion implantation into one wafer, a plurality of types of patterns of the time in which a voltage is applied or removed are retained for each of the partial ion implantation regions which are set in plural, and a plurality of types of patterns of the number of scanning times of the ion beam are retained.

10. The ion implantation method according to claim 1, wherein a first scanning frequency of the ion beam at the time of measuring the ion beam before ion implantation into the wafer is performed for measuring a beam width in the direction orthogonal to the scanning direction of the scanned ion beam and a beam current value of which the beam passes through a unit area in a unit time is different from a second scanning frequency of the ion beam during ion implantation into the wafer plane.

11. The ion implantation method according to claim 10, wherein the first scanning frequency is 40 Hz or higher, and the second scanning frequency is 1 Hz or lower.

12. The ion implantation method according to claim 1, further comprising creating a plurality of types of ion implantation regions such that at least one of an ion implantation region length in the scanning direction of the ion beam, an ion implantation region length in the direction orthogonal to the scanning direction of the ion beam, and the dose of the ion implantation regions are different.

13. The ion implantation method according to claim 12, wherein the ion implantation region length in the scanning direction of the ion beam is set in the range of 2 mm or longer and 80 mm or shorter.

14. The ion implantation method according to claim 12, wherein the ion implantation region length in the direction orthogonal to the scanning direction of the ion beam is set in the range of 2 mm or longer and 80 mm or shorter.

15. The ion implantation method according to claim 12, wherein the dose of the ion implantation regions are set in the range of $1E13/cm^2$ or more and $1E17/cm^2$ or less.

* * * * *